United States Patent [19]

Bismarck

[11] Patent Number: 4,502,014
[45] Date of Patent: Feb. 26, 1985

[54] COINCIDENT PULSE CANCELLING CIRCUIT

[75] Inventor: Otto H. Bismarck, Fords, N.J.

[73] Assignee: RCA Corporation, New York, N.Y.

[21] Appl. No.: 444,164

[22] Filed: Nov. 24, 1982

[51] Int. Cl.³ .................... H03K 21/06; H03K 19/21
[52] U.S. Cl. .................................. 328/110; 307/470;
 307/518; 307/273; 307/291; 328/133; 377/111
[58] Field of Search ............... 307/443, 470, 510, 514,
 307/518, 528, 273, 291; 328/55, 63, 110, 133;
 377/55, 111

[56] References Cited

U.S. PATENT DOCUMENTS

| 3,560,859 | 2/1971 | Thompson | 377/111 X |
|---|---|---|---|
| 3,593,161 | 7/1971 | Ritz | 307/528 X |
| 4,109,209 | 8/1978 | Bismarck | 328/55 X |
| 4,185,210 | 1/1980 | Zuk | 307/528 |
| 4,354,124 | 10/1982 | Shima et al. | 307/514 X |
| 4,398,101 | 8/1983 | Friauf | 307/470 X |
| 4,398,105 | 8/1983 | Keller | 307/443 X |
| 4,403,193 | 9/1983 | Takemura | 307/514 X |

Primary Examiner—Stanley D. Miller
Assistant Examiner—David R. Hudspeth
Attorney, Agent, or Firm—Joseph S. Tripoli; George E. Haas; Henry I. Schanzer

[57] ABSTRACT

A circuit responsive to pulses on first and second input signal lines for blocking the propagation of these pulses and inhibiting the production of corresponding pulses on output lines when pulses are present at the same time on the input lines and for producing output pulses corresponding to the pulses on the input lines when there is no coincidence or concurrence of pulses on the two input lines.

3 Claims, 5 Drawing Figures

COINCIDENT PULSE CANCELLING CIRCUIT

This invention relates to pulse conditioning circuits and, in particular, to pulse propagation control circuits responsive to the coincidence, or lack thereof, of input pulses on different ones of its input lines.

By way of example, an Up/Down counter may be responsive to each pulse of a pulse train applied to a first signal line for counting up, and to each pulse of a second pulse train applied to a second signal line for counting down. The counter is apt to miscount if pulses occur at the same time on the first and second lines.

The miscount problem may be solved by use of a pulse staggering circuit as taught in U.S. Pat. No. 4,109,209. The patented pulse staggering circuit includes: (a) means for sensing and storing the occurrence of pulses on first and second lines; (b) means for determining the order in which the pulses occurred; and (c) means for inhibiting the passage of the second pulse to occur until the first pulse has fully passed through the staggering circuit and has been applied to a utilization or load device. After the passage of the first pulse, the second pulse, being stored, is then allowed to pass through the circuit and to the load device. Thus, the staggering circuit ensures that asynchronous pulses present concurrently on first and second lines are propagated one after the other to a load.

Applicant's invention resides in part in the recognition that where, for example, a pulse on one line tends to cause a counter to count up and a concurrent pulse on the other line tends to cause the counter to count down, it is more efficient, and faster, to cancel the effect of the two "coincident" pulses. This saves the power and time necessary to cause the counter to count one way and then the other way.

The invention also resides in circuitry responsive to the occurrence of pulses on first and second input lines for generating an output pulse corresponding to each input pulse when there is no coincidence of input pulses on the two input lines and for cancelling the effect of the input pulses and inhibiting the generation of output pulses when input pulses are concurrently present on the first and second lines.

In the accompanying drawings like reference characters denote like components; and FIG. 1 is a logic diagram of a pulse cancelling circuit embodying the invention;

In the discussion to follow, it will be convenient to discuss operation in Boolean terms. The convention arbitrarily adopted is that the most positive voltage used in the system represents the binary digit "1" or "high" condition and the least positive voltage represents the binary digit "0" or "low" condition. To further simplify the explanation of the circuit operation, it will sometimes be stated that a high or a low is applied to a circuit or obtained from a circuit rather than stating that a voltage which is indicative of a high or a low is applied to or derived from a circuit.

Figure 1:
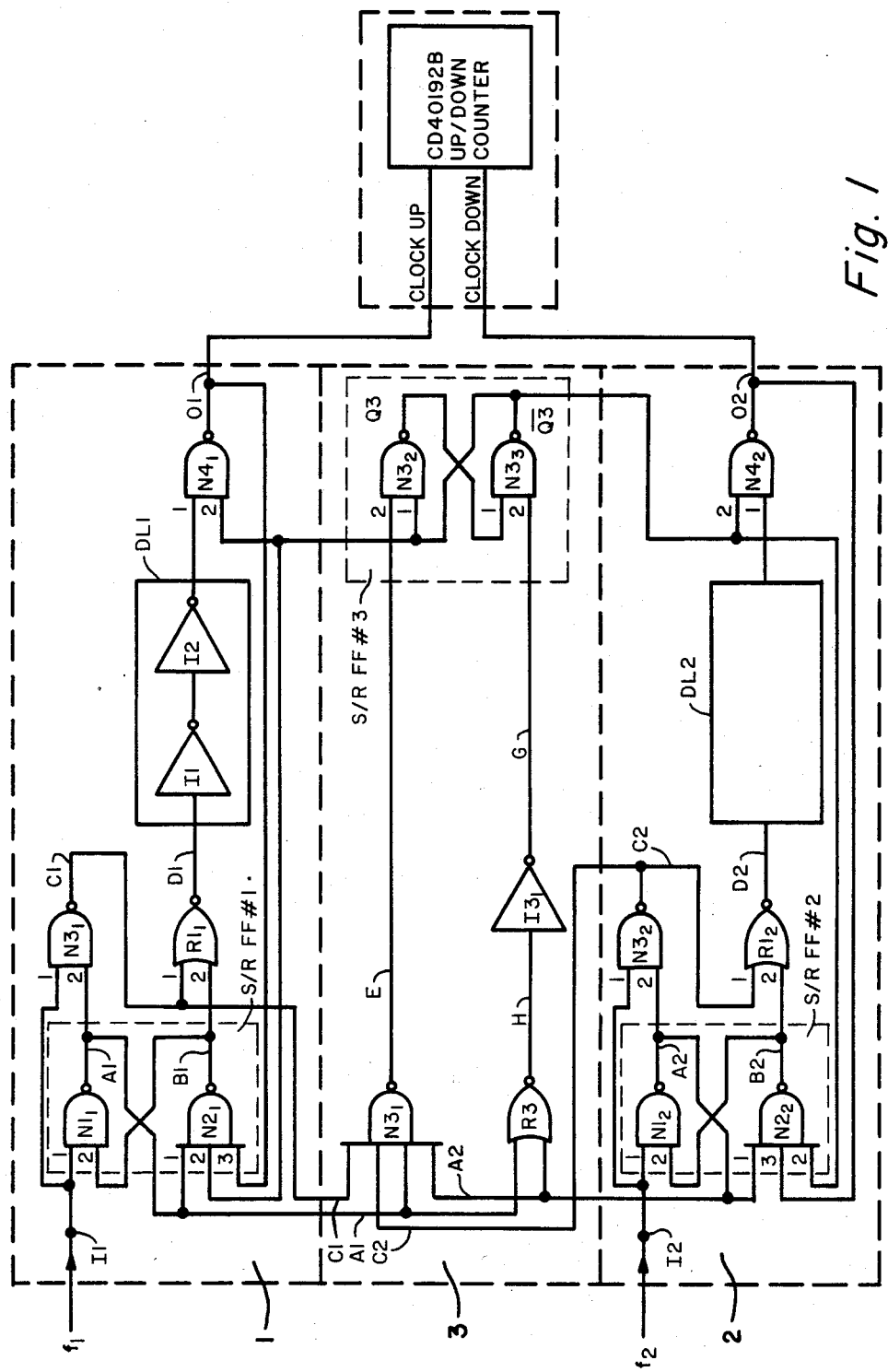
Figure 2B:
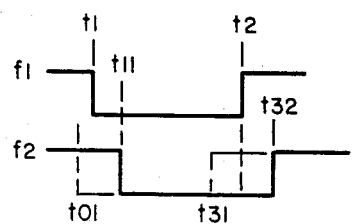
FIGS. 2A and 2B are diagrams showing possible relationships between pulses on two different input lines.
Figure 2A:
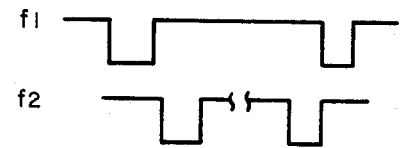

The circuit of FIG. 1 includes first and second pulse storage networks 1 and 2, respectively, and a pulse cancelling network 3. Each one of networks 1 and 2 includes a signal input terminal, I1 and I2, respectively, to which is applied input pulse signals f1 and f2, respectively. f1 and f2 pulses may occur asynchronously with respect to each other as shown in FIGS. 2A and 2B. FIG. 2A illustrates the non-coincident conditions which occur when a pulse (e.g. f1-low) is present on a line before or after a pulse (e.g. f2-low) is present on the other line. FIG. 2B illustrates possible "coincident" conditions defined in this example as the f1 and the f2 signals being "low" at the same time. The pulse signals f1 and f2 may be part of pulse trains produced by any number of signal source or sources (not shown).

Networks 1 and 2 are structurally the same, and their corresponding elements are denoted with similar reference characters with the last digit (i) of the elements in each network being a 1 or a 2 corresponding to whether the element is in network 1 or 2. In networks 1 and 2 a pulse signal fi is applied to input-1 of a two-input NAND gate N1i and to input-1 of two-input NAND gate N3i. Gate N1i is cross-coupled with a three-input NAND gate N2i to form a set/reset flip-flop FFi. As detailed below FF1 and FF2 are set by the leading edge of pulses at their corresponding inputs and thus function to store the occurrence of an input pulse; that is, FF1 or FF2 is set when its corresponding f1 or f2 pulse makes a high-to-low transition. Also, as detailed below, NAND gate N3i, NOR gate R1i, delay network DLi, NAND gate N4i and NAND gate N2i function, in one mode, like a one-shot to produce a single self-terminating output pulse (Oi) after the occurrence (on the trailing edge) of an input pulse (fi). The signal, Ai, at the output of N1i is applied to input-2 of N3i and to input-1 of N2i. The signal Bi at the output of NAND gate N2i is coupled to input-2 of N1i and to input-2 of a two-input NOR gate R1i. The signal Ci at the output of NAND gate N3i is applied to input-1 of R1i. The signal Di at the output of R1i is coupled via a delay network, DLi, to input-1 of a two-input NAND gate N4i. The output signal Oi of N4i, is fed back to input-3 of N2i.

Delay networks DL1 and DL2 may be formed, as shown for DL1 in FIG. 1, by cascading two inverters (I11 and I21). However, any number of known suitable delay networks may be used instead. The time delay of each delay network may be increased by the addition of discrete capacitance(s) at circuit nodes between the output of R11 and the input of N41 or by cascading additional inverters with I11 and I21. The time delay of DL1 and DL2 determines the pulse width of the output pulses produced at outputs O1 and O2. The output pulses must have sufficient width to ensure proper response of the Up/Down counter.

Pulse cancelling network 3 includes a four-input NAND gate N31, two two-input NAND gates N32 and N33, a two input NOR gate R3 and an inverter I31. The A1 and C1 signals from network 1 and the A2 and C2 signals from network 2 are applied to the 4-inputs of NAND gate N31. Signals A1 and A2 are also applied to the two-inputs of R3. The signal E at the output of N31 is applied to input-2 of N32. The signal Q3 at the output of N32 is applied to input-1 of N33 and the signal $\overline{Q3}$ at the output of N33 is applied to input-1 of N32. N32 and N33 are thus cross-coupled to form a set-reset flip-flop, FF3. $\overline{Q3}$ is also applied to input-2 of N41 and N42 and input-2 of N21 and N22. The signal H at the output of R3 is applied to the input of I31 whose output signal G is applied to input-2 of N33. The combination of R3 and I31 functions as a logical OR gate whereby the output G is equal to the OR function of inputs A1 and A2.

The output O1 of network 1 is connected to the clock-up input of an Up/Down Counter which may be, for example, the CD40192B manufactured by RCA Corporation and the output O2 of network 2 is connected to the clock-down input of the CD40192B. The CD40192B is used by way of example and any other suitable load device may be used in conjunction with the circuit of FIG. 1.

In the description of the circuit of FIG. 1 the leading or rising edge of an input pulse occurs on a high-to-low transition while the falling or trailing edge of a pulse occurs on a low-to-high transition. Hence, for the circuit of FIG. 1 a non-coincident condition occurs when a pulse (f1 or f2) at one of the two inputs (I1 and I2) goes from the high-level-to-the-low-level and then returns from the low-level-to-the-high-level while the signal at the other input remains at the high level. A coincident condition occurs when a signal at one of the two inputs goes from high-to-low and the signal at the other input goes from high-to-low before the signal at the one input returns from the low level to the high level.

Figure 3:
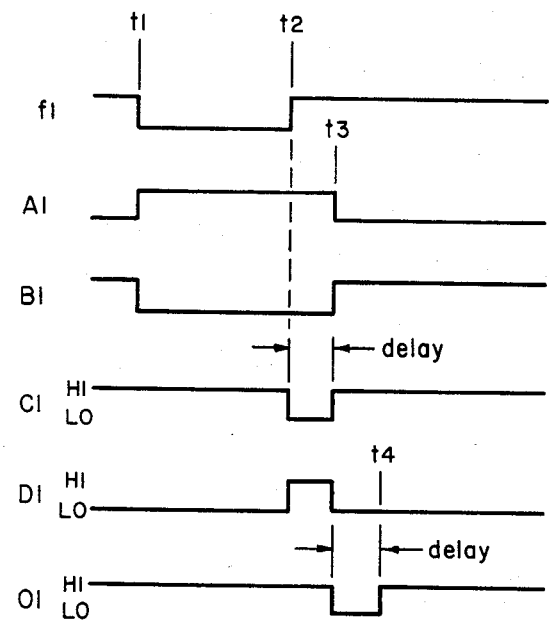
FIG. 3 is a diagram of waveforms associated with the circuit of FIG. 1.

For ease of description the operation of the circuit of FIG. 1 will be first described for the non-coincident condition with the aid of FIG. 3.

Assume that initially (prior to time $t_1$) f1 and f2 are high. For this condition, as will be shown below, A1 and A2 are low, B1 and B2 are high, C1 and C2 are high, D1 and D2 are low and O1 and O2 are high. Assume also that Q3 is low and that $\overline{Q3}$ high (i.e. FF3 is reset) and that E is high, H is high and G low. The significant signal conditions of network 1 for f1-high, prior to time $t_1$, are shown in FIG. 3.

It will now be shown that when a pulse occurs on one input line an output pulse is produced corresponding to the input pulse, in the absence of the concurrent occurrence of a pulse on the other input line. Thus, assume that at time $t_1$, f1 makes a transition from high-to-low, as shown in FIG. 3, while f2 remains high. Applying a low to I1 causes the output, A1, of N11 to go high and the output, B1, of N21 to go low. Thus, on the leading edge (i.e. negative transition) of an f1 pulse FF1 is placed in its set condition with A1=high and B1=low. The occurrence (i.e. high-to-low transition) of the f1 pulse is thus stored in network 1. As discussed below network 1 uses the stored information (i.e. that FF1 is set) on the trailing edge of the f1 pulse to subsequently produce an output pulse at O1. Although A1 is high, the signal C1 at the output of N31 remains high since f1 is now low. B1 which is now "low" and C1 which is "high" applied to the two inputs of R11 cause D1 to remain low (since C1 remains high). The input to, and output of, delay network DL1 thus remains low causing the output O1 of N41 to remain high.

The A1-high and C1-high signals are applied to network 3. This causes H to go from high-to-low and G to go from low-to-high but since A2 and C2 are low, E remains high and FF3 remains reset with Q3=low and $\overline{Q3}$=high; (i.e. when FF3 is reset it can be subsequently set only by a negative or low signal at E). Thus, when f1 goes from high-to-low, A1-goes high and B1-goes low while the other signals in network 1 remain unchanged. Network 2 is unaffected and while the outputs of gates R3 and I31 in network 3 change state, the Q3 output applied to gates N21, N22, N41 and N42 remains unchanged.

Assume that, at time $t_2$, f1 goes from low-to-high while f2 (not shown in the drawing), which has been high since before $t_1$, continues in that condition. When f1 goes from low-to-high the two inputs to N31 are high and its output, C1, goes low as shown in FIG. 3. Since FF1 is set and B1 is held low, when C1 goes low the signal D1 at the output of NOR gate R11 goes high. The low-to-high transition of D1 must propagate through delay network DL1 for a delay time, Td, before causing a change at the input of N41. Thus, at a time $t_3$, which is a time Td after $t_2$, the signal at input-1 of N41 goes high. Both inputs to N41 are now high and the signal, O1, at its output goes low. O1-low, and being fed back to gate N21, causes B1 to go high and (since f1 is now high) A1 to go low as shown in FIG. 3. The "low" produced at O1 thus resets FF1 and initiates the termination of the output pulse. When A1 goes low, it causes C1 to go high. Either C1 which is driven high or B1 which is reset to the high level causes D1 to go from high-to-low. The high-to-low transition of D1 is propagated along the delay network DL1 for a time Td. At time $t_4$, a time Td after $t_3$, D1-low is applied to gate N41 causing O1 to go high as shown in FIG. 3. Thus, following the trailing edge of the f1 pulse an output pulse O1 is produced at the output of N41 having a pulse width primarily set by the time delay Td of DL1. The O1-high signal fed back to gate N21, causes no further change to FF1 which remains reset.

On the trailing edge of f1, since A1 goes low E remains high, H goes high, and G goes low maintaining FF3 reset (i.e. Q3=low, $\overline{Q3}$=high). Hence, the occurrence of an f1 pulse (in the absence of an f2 pulse) has no significant effect on network 3 and no effect on network 2.

Network 2 functions in the same manner as network 1 and a detailed description of its operation is deemed unnecessary. Suffice it to say that each one of networks 1 and 2 produces a pulse at its output (O1 or O2) whenever an input pulse is applied to its input and no input pulse is concurrently applied to the input of the other network.

It will now be shown that when an f1 (or f2) pulse occurs concurrently with an f2 (or f1) pulse the fact of their occurrence is erased or cancelled. The response of the circuit will now be examined for the following sequence of input pulse variations: (a) f1=f2=high; (b) one of f1 and f2 goes low; (c) the other one of f1 and f2 goes low; (d) one of f1 and f2 goes high; and (e) the other one of f1 and f2 goes high.

(a) As discussed above, when f1 is low FF1 is set such that A1 is high, and B1 is low and C1 is held high.

(b) In a similar manner when f2 is low FF2 is set such that A2 is high, and B2 is low while C2 is held high.

(c) Now, when f1 and f2 pulses are present (i.e. f1=f2=low) at the same time, then A1, C1, A2 and C2 are all high at the same time causing the output E of N31 to go low. Concurrently, with both A1 and A2 being high, the output H of R3 goes low and the output G of I31 goes high. When E goes low the output Q3 of N32 goes high. The application of Q3 high and G high to the inputs of N33 causes Q3 to go low, thus placing FF3 to its set state. Q3 low applied to gates N41 and N42 causes O1 and O2 to remain at the high level. Holding O1 and O2 high inhibits the production of a low level and hence of output pulses at O1 and O2. Concurrently, Q3-low applied to NAND gates N21 and N22 causes B1 and B2 to go high. Placing B1 and B2 at the high level, prior to the trailing edge of f1 and/or f2, causes the outputs D1 and D2 of NOR gates R11 and R12, respectively, to remain low if, and when, C1 or C2 goes low in response to the trailing edge of an f1 or f2 pulse. This prevents or aborts the subsequent production of output pulses at O1 and O2 and hence effectively cancels or erases the concurrent occurrence of an f1 and an f2 pulse.

(d) It will now be shown that no pulse is produced at O1 when f1 goes high, after f1 *and* f2 had been low and with f2 still low. A positive transition at f1 is used by way of example only, f2 could have been used instead. Recall that when f1 and f2 are low, $\overline{Q3}$ is set low and B1 and B2 are reset high. However, when f1=f2=low, A1 and A2 are not the complement of B1 and B2. A1 and A2 as well as B1 and B2 are high. When subsequently f1 goes high it causes A1 to go low, thereby resetting FF1 to the state in which A1 is low and B1 is high. When A1 goes low it causes C1 to go high. D1 which was held low by B1-high remains low. Hence, D1 does not change. Since D1 remains low, input-1 of NAND gate N41 remains low and O1 remains high. Hence, no pulse is produced at the output of network 1 on the trailing edge of the f1 pulse because B1 was reset to the high level by $\overline{Q3}$ going low before the trailing edge (low-to-high transition) of f1.

The effect of f1 going low-to-high on network 3 is now examined. When f1 goes high A1 goes low and C1 goes high. When A1 goes low, E, goes from low-to-high. However, H, does not change state since A2 remains high. Hence, H remains low and G remains high. As long as G remains high, FF3 remains in the set state (i.e. $\overline{Q2}$ low and Q3 high) to which it was driven when f1 and f2 were concurrently low.

Since the circuit is symmetrical, if f2 goes high before f1 goes high, the effect on network 3 would be that described above and therefore this condition need not be detailed separately.

(e) Assume now that f2 goes high after f1 has gone high, following f1 and f2 being low. When f2 goes high A2 goes low. When A2 goes low, H goes high since A1 and A2 are now both low. When H goes high G goes low. As soon as G goes low, $\overline{Q3}$ goes high. Since E was already high the two inputs of N32 are now high and Q3 goes low. FF3 is thus reset to its original condition with $\overline{Q3}$ high and Q3 low. Thus, when f1 and f2 return to the high level, networks 1, 2 and 3 are returned to their original condition without a pulse being produced at O1 and/or O2 and with all indications of the presence of a pulse being erased. Hence, the circuit cancels the occurrence of an input signal applied to the circuit indicating an up (or down) count if a pulse is concurrently applied indicating a down (or up) count.

Thus, it has been shown that each one of pulse storage circuits 1 and 2 includes a set/reset flip flop and a "one-shot" or pulse generating circuit. On the leading edge of an input pulse the flip-flop is set and the one-shot circuit is primed. On the trailing edge of the input pulse the one-shot circuit is triggered and produces an output pulse which is also used to reset the flip-flop, if the flip-flop is still in the set state (and it will so be in the absence or non-occurrence of a pulse on the other line). The one-shot like feature in networks 1 and 2 ensures that an output pulse at O1 and O2 formed in each one of networks 1 and 2 is self-terminating or self-extinguishing. Consequently, the circuit of FIG. 1 is self-clocking since the input pulses (f1, f2) in combination with the one-shot circuits function to produce output pulses. This enables a simple and efficient system to be built. If pulses are present at the same time on the two input lines the flip-flops (FF1 and FF2) of the networks 1 and 2 are reset, the one-shot circuitry is inhibited from operating, and no output pulses are subsequently produced at the outputs.

The circuit of FIG. 1 has been discussed for the condition of negative going pulses. It should be appreciated that the NAND gates could be replaced by NOR gates and the NOR gates by NAND gates and the circuit would then be responsive to positive going (low-to-high and then high-to-low) pulses.

Figure 4:
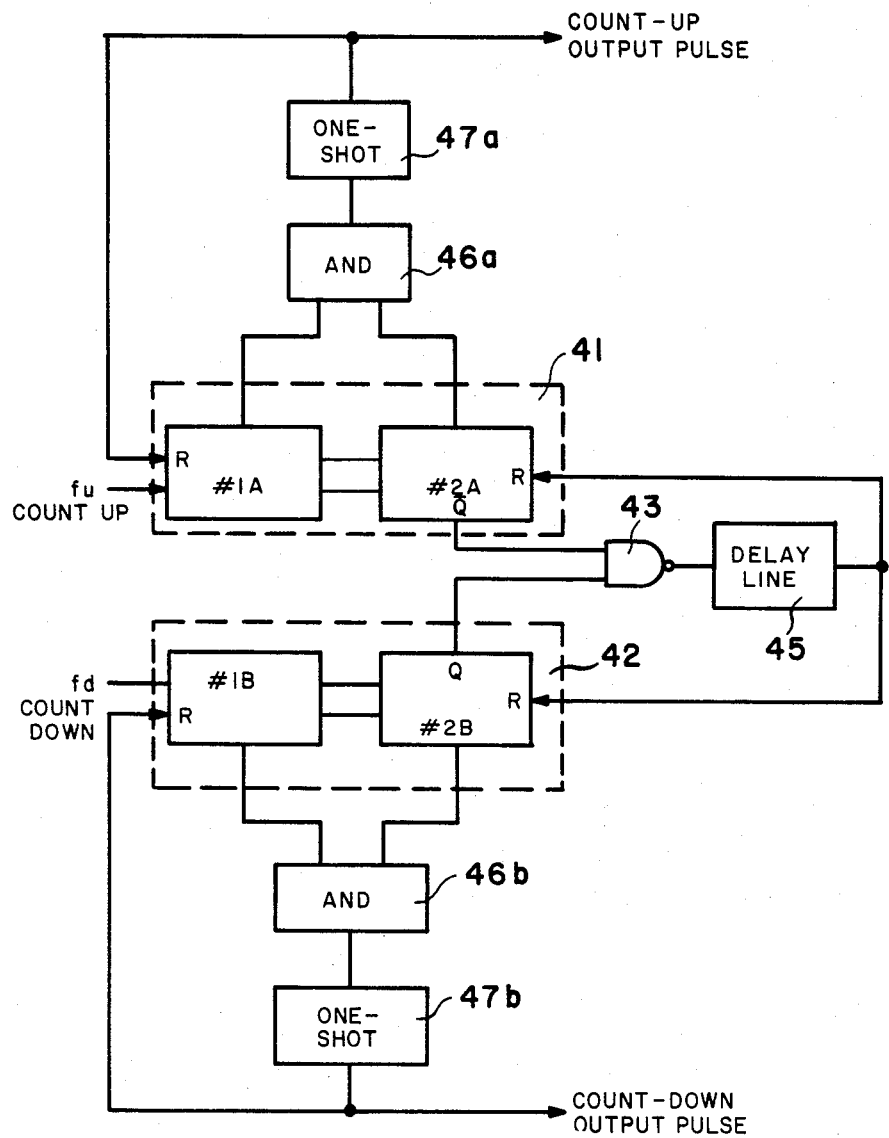
FIG. 4 is a logic diagram of another pulse cancelling circuit embodying the invention.

Another pulse propagation control circuit is shown in FIG. 4. A count-up pulse train fu is applied to, and stored in, a first shift register string 41 and a count-down pulse train fd is applied to, and stored in, a second shift register string 42. In this embodiment, shift registers 41 and 42 contain two storage stages (SR1A–SR2A and SR1B–SR2B). A detection circuit, comprised of a NAND gate 43 and a delay line 45 (e.g. 2 cascaded inverters), functions to cancel one pulse from each pulse train, in pairs, when pulses are present concurrently in the last stage of the shift registers. An overflow pulse generator comprised of an AND-type logic gate (e.g. 46a, 46b) and a one-shot (e.g. 47a, 47b) is coupled to the last two stages of each shift register string. When pulses are present in the two stages of one shift register and no pulse is present in the last stage of the other shift register, a corresponding overflow pulse is produced indicative of the presence of pulses in the one shift register.

The storage elements or stages in each one of shift registers 41 and 42 are similar to storage circuits used in first-in first-out (FIFO) registers. The input pulses (fu or fd) "ripple down" from one storage stage to the next until stopped in the last storage stage of the string, in a similar fashion to that found in FIFO registers. The coincidence of a count-up pulse in the last stage of register 41 and a count down pulse in the last stage of register 42 is detected by NAND gate 43 whose output goes to a logic "0" condition when coincidence occurs. After a short delay, provided by delay network 45, required for proper timing, the logic "0" output of NAND gate 43 resets the last storage stage (SR2A and SR2B) in the two strings, thereby cancelling the stored pulses, in pairs. After the last storage stage in each string has been reset, other pulses, if stored in preceding stages, can ripple down to the last stage of the shift registers.

When there is no coincidence of pulses in the two strings (i.e. two more pulses are, or were, applied to one line than to the other), a count-up or count-down output pulse is produced which can be applied to an appropriate utilization device (not shown) connected to the circuit output. Assume for example that, in response to the application of more fd pulses than fu pulses, the last two stages of string 42 are set (indicative of the presence of two stored pulses) while the last two stages of 41 are reset (indicative of no pulses being stored). The presence of the pulse storing condition in string 42 is detected by AND gate 46b whose output then enables one-shot circuit 47b which generates a count-down pulse. The one-shot output is also used to reset the first stage of string 42 so that the pulse stored therein does not get counted twice.

What is claimed is:

1. The combination comprising:

first and second inputs each for receiving input pulses;

first and second networks coupled to said first and second inputs, respectively, each network including a storage means set to a first state in response to the leading edge of an input pulse at its input, and each network including means responsive to the trailing edge of the input pulse and to its storage means being set to said first state for producing an output pulse at a respective output; and control means, coupled to the storage means of said first and second networks, responsive to the coincident presence of input pulses at said first and second inputs for resetting the storage means to a second state in said first and second networks and preventing the subsequent production of output pulses on the trailing edges of the input pulses.

2. The combination as claimed in claim 1 wherein the storage means in each one of said first and second networks is a set-reset flip-flop and wherein said means responsive to the trailing edge includes a one-shot circuit having its input coupled to be responsive to the input pulse, for producing said output pulse; and
  wherein the output of the one-shot is fed back to said storage means for resetting it to said second state following the occurrence of the trailing edge of an input pulse.

3. The combination as claimed in claim 2 wherein said control means includes means responsive to both the storage means of said first and second networks being set to said first state for resetting both of their storage means and placing them in said second state.

* * * * *

UNITED STATES PATENT AND TRADEMARK OFFICE
CERTIFICATE OF CORRECTION

PATENT NO. : 4,502,014
DATED : Feb. 26, 1985
INVENTOR(S) : Otto H. Bismarck

It is certified that error appears in the above-identified patent and that said Letters Patent is hereby corrected as shown below:

Col. 3, line 66, change "Q3" to --- $\overline{Q3}$ ---.
Col. 4, line 61, change "Q3" to --- $\overline{Q3}$ ---.
Col. 4, line 62, change "Q3" to --- $\overline{Q3}$ ---.
Col. 4, line 66, change "Q3" to --- $\overline{Q3}$ ---.

Signed and Sealed this

Twenty-second Day of October 1985

[SEAL]

Attest:

DONALD J. QUIGG

Attesting Officer

Commissioner of Patents and
Trademarks—Designate